United States Patent
Chang et al.

(10) Patent No.: US 8,183,769 B2
(45) Date of Patent: May 22, 2012

(54) ORGANIC ELECTROLUMINESCENT DISPLAY UNIT AND METHOD FOR FABRICATING THE SAME

(75) Inventors: Ting-Kuo Chang, Hsinchu (TW); Chun-Hsiang Fang, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/907,033

(22) Filed: Oct. 19, 2010

(65) Prior Publication Data

US 2012/0032582 A1 Feb. 9, 2012

(30) Foreign Application Priority Data

Aug. 4, 2010 (TW) .............................. 99125934 A

(51) Int. Cl.
*G09G 3/30* (2006.01)
*H01J 1/62* (2006.01)
(52) U.S. Cl. ............................. 313/506; 445/24; 345/81
(58) Field of Classification Search .......... 313/504–512; 345/76, 81
See application file for complete search history.

(56) References Cited

U.S. PATENT DOCUMENTS

| | | | | |
|---|---|---|---|---|
| 5,929,845 A * | 7/1999 | Wei et al. | ....................... | 345/156 |
| 6,320,325 B1 * | 11/2001 | Cok et al. | .................... | 315/169.3 |
| 6,563,479 B2 * | 5/2003 | Weindorf et al. | ................ | 345/77 |
| 7,218,048 B2 * | 5/2007 | Choi et al. | ...................... | 313/504 |
| 7,289,088 B2 * | 10/2007 | Matsumoto | ..................... | 345/76 |
| 7,385,572 B2 * | 6/2008 | Yu et al. | .......................... | 345/76 |
| 2009/0201228 A1 | 8/2009 | Kim et al. | | |

* cited by examiner

*Primary Examiner* — Peter Macchiarolo
(74) *Attorney, Agent, or Firm* — Jianq Chyun IP Office

(57) ABSTRACT

An organic electroluminescent display unit suitable to be electrically connected to a scan line and a data line including at least one transistor, a first photo-sensor, a second photo-sensor, a conductive layer, an organic electroluminescent layer and a cathode layer is provided. The conductive layer entirely covers the second photo-sensitive layer. A method of fabricating an organic electroluminescent display unit with the integrating a fabrication of a photo-sensor into a fabrication of the organic electroluminescent display panel is further provided. The cost for fabricating the organic electroluminescent display unit of the invention can be further reduced.

17 Claims, 7 Drawing Sheets

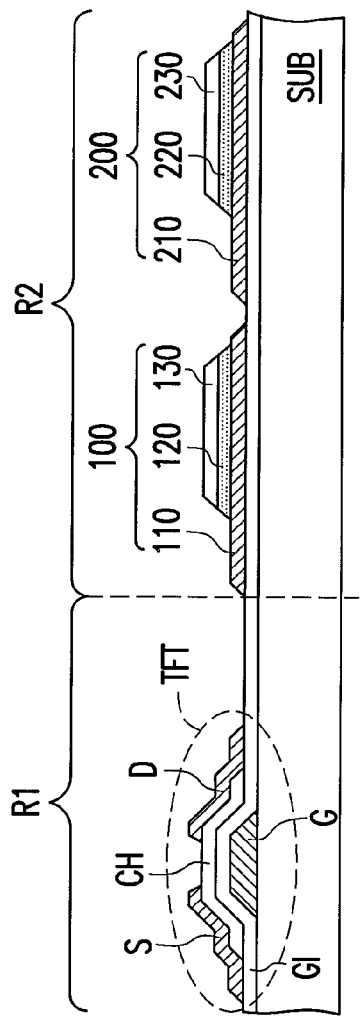
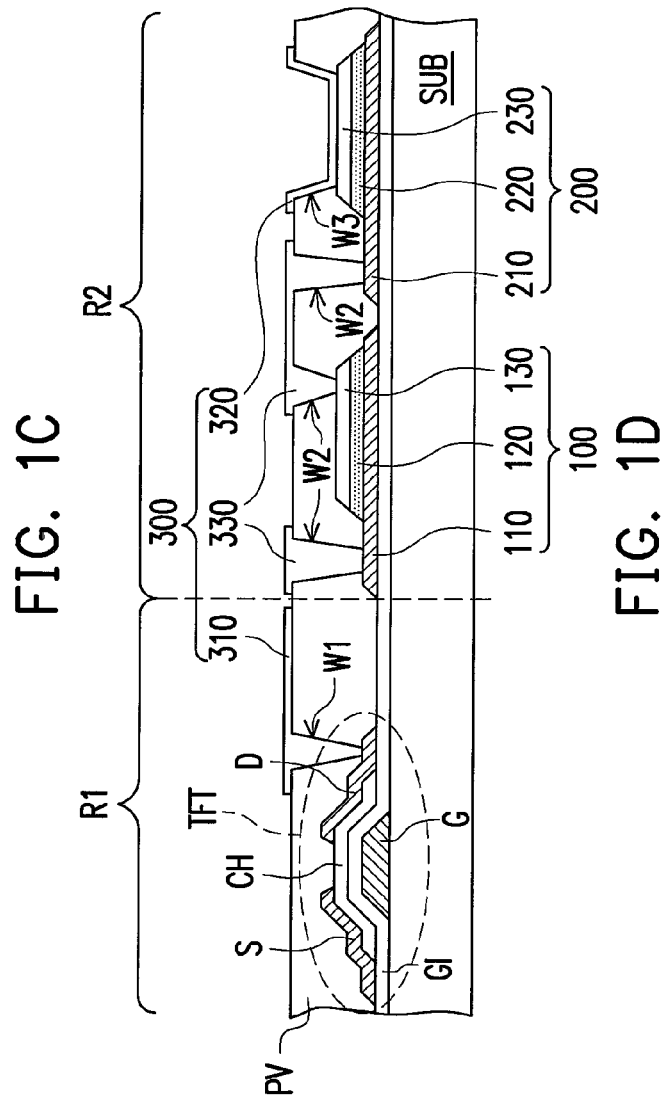
FIG. 1C
FIG. 1D

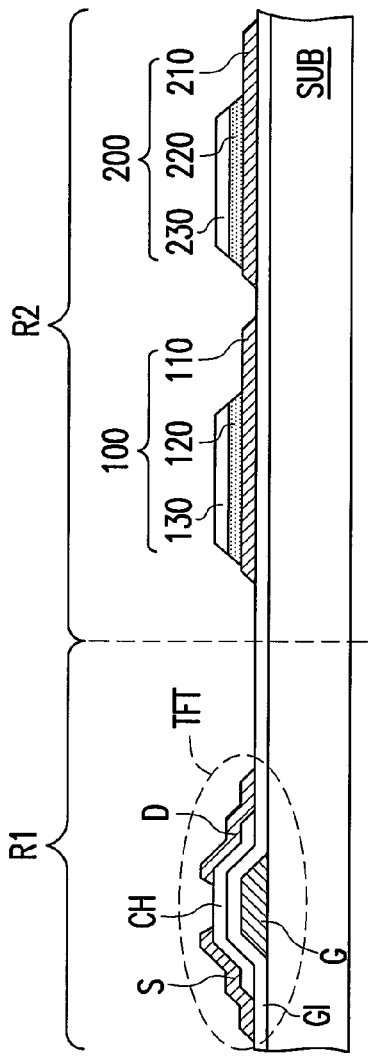
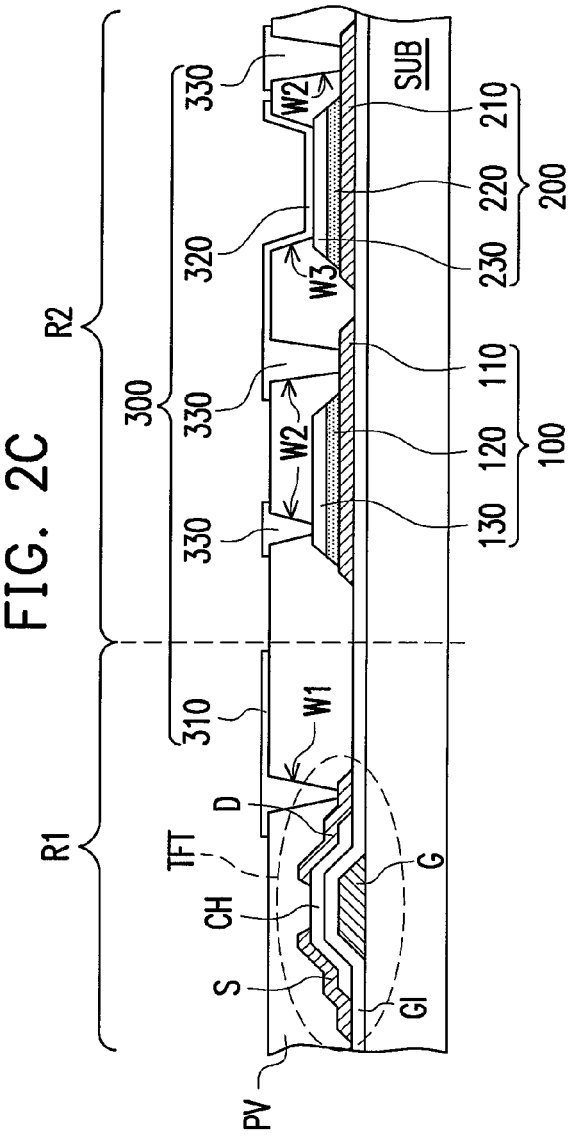

| Type | Dark | 100Lux | 200Lux | 500Lux | 1000Lux | 2000Lux | 3000Lux | 3800Lux |
|---|---|---|---|---|---|---|---|---|
| I1(nA) | 0.35575 | 28.4691 | 48.6792 | 96.4992 | 155.365 | 254.058 | 338.284 | 391.637 |
| I2(nA) | 0.22401 | 0.23479 | 0.25415 | 0.30116 | 0.38208 | 0.50937 | 0.6303 | 0.7194 |

ORGANIC ELECTROLUMINESCENT DISPLAY UNIT AND METHOD FOR FABRICATING THE SAME

CROSS-REFERENCE TO RELATED APPLICATION

This application claims the priority benefit of Taiwan application serial no. 99125934, filed on Aug. 4, 2010. The entirety of the above-mentioned patent application is hereby incorporated by reference herein and made a part of this specification.

BACKGROUND OF THE INVENTION

1. Field of the Invention

The invention relates to a display unit and a method for fabricating the same, and more particularly to an organic electroluminescent display unit and a method for fabricating the same.

2. Description of Related Art

Due to increasing concerns for the environment, flat display panels with superior characteristics such as low consumption power, high space utilization efficiency, free of radiation, high image quality and so on have become the main stream in the market. Conventional flat displays include liquid crystal displays, plasma displays, organic electroluminescent displays, and the like. As an example, organic electroluminescent displays are self-luminescent displays that do not require backlight modules. Consequently, the fabrication cost of backlight modules and power consumed by backlight modules are saved. In addition, since organic electroluminescent displays do not have the viewing angle issue but have characteristics including full-colorization, high response speed, and the like, organic electroluminescent displays are a type of flat display panel that has high performance and environmental concept.

In conventional technology, a single photo-sensor is used for sensing the intensity of external light to adjust the organic electroluminescent display to display suitable brightness. The power consumption of the organic electroluminescent display is thus reduced and energy saving effect can be achieved. However, in conventional technology, the accuracy of the photo-sensor is easily affected by the interference of scanning circuit, environmental temperature, or other factors. When the photo-sensor cannot adjust the brightness of the organic electroluminescent display effectively according to the intensity of external light, the organic electroluminescent display cannot display suitable brightness, such that the consumption power of the organic electroluminescent display cannot be reduced effectively. Accordingly, how to improve the accuracy of the photo-sensor and integrate the fabrication of the photo-sensor into the fabrication of the organic electroluminescent display panels is one of the issues to be solved by researchers.

SUMMARY OF THE INVENTION

The invention is directed to an organic electroluminescent display unit and a method of fabricating the same so as to integrate a fabrication of a photo-sensor into a fabrication of an organic electroluminescent display panel.

The invention is directed to an organic electroluminescent display unit suitable to be electrically connected to a scan line and a data line. The organic electroluminescent display unit includes at least one transistor, a first photo-sensor, a second photo-sensor, a conductive layer, an organic electroluminescent layer, and a cathode layer. The at least one transistor is electrically connected to the scan line and the data line. The first photo-sensor includes a first reflective bottom electrode, a first photo-sensitive layer, and a first transparent top electrode. Here, the first photo-sensitive layer is sandwiched between the first reflective bottom electrode and the first transparent top electrode. The second photo-sensor includes a second reflective bottom electrode, a second photo-sensitive layer and a second transparent top electrode. The second photo-sensitive layer is sandwiched between the second reflective bottom electrode and the second transparent top electrode. The first photo-sensor is electrically connected to the second photo-sensor. The conductive layer includes a reflective pixel electrode, a light-shielding pattern, and a connection pattern. The reflective pixel electrode is electrically connected to the transistor. The light-shielding pattern is electrically connected to the second transparent top electrode and the light-shielding pattern entirely covers the second photo-sensitive layer. The connection pattern is electrically connected to the first transparent top electrode, the first reflective bottom electrode, and the second reflective bottom electrode. The organic electroluminescent layer is disposed on the reflective pixel electrode and the cathode layer is disposed on the organic luminescent layer.

In one embodiment of the invention, the transistor includes a gate, a channel layer, a source, and a drain. The source and the drain are located on a portion of the channel layer and the source and the drain are electrically insulated from each other.

In one embodiment of the invention, the channel layer is located above the gate.

In one embodiment of the invention, the first reflective bottom electrode, the second reflective bottom electrode, the source, and the drain are substantially fabricated with a same material.

In one embodiment of the invention, the connection pattern merely shields a portion of the first photo-sensitive layer such that the first photo-sensitive layer is capable of receiving external light.

In one embodiment of the invention, the organic electroluminescent display unit further includes a passivation layer. The passivation layer covers the transistor, the first photo-sensor, and the second photo-sensor.

In one embodiment of the invention, the passivation layer has a first contact window, a plurality of second contact windows, and a third contact window. The reflective pixel electrode is electrically connected to the transistor via the first contact window. The connection pattern is electrically connected to the first transparent top electrode, the first reflective bottom electrode, and the second reflective bottom electrode via the second contact windows. The light-shielding pattern is electrically connected to the second transparent top electrode via the third contact window.

In one embodiment of the invention, the organic electroluminescent display unit further includes a pixel definition layer. The pixel definition layer covers the conductive layer and has an opening. The reflective pixel electrode is exposed by the opening, and the organic electroluminescent layer is disposed within the opening.

In one embodiment of the invention, the cathode layer covers the organic electroluminescent layer and the pixel definition layer.

In one embodiment of the invention, the cathode layer is a transparent cathode layer.

The invention is further directed to a method of fabricating an organic electroluminescent display unit. The method includes the following. At least one transistor, a first photo-sensor and a second photo-sensor electrically connected to the first photo-sensor are formed on a substrate. The first photo-sensor includes a first reflective bottom electrode, a first photo-sensitive layer, and a first transparent top electrode. The first photo-sensitive layer being sandwiched between the first reflective bottom electrode and the first transparent top electrode. The second photo-sensor includes a second reflective bottom electrode, a second photo-sensitive layer, and a second transparent top electrode. The second photo-sensitive layer is sandwiched between the second reflective bottom electrode and the second transparent top electrode. A conductive layer including a reflective pixel electrode, a light-shielding pattern, and a connection pattern is formed. The reflective pixel electrode is electrically connected to the transistor. The light-shielding pattern is electrically connected to the second transparent top electrode and the light-shielding pattern entirely covers the second photo-sensitive layer. The connection pattern is electrically connected to the first transparent top electrode, the first reflective bottom electrode, and the second reflective bottom electrode. An organic electroluminescent layer is formed on the reflective pixel electrode and a cathode layer is formed on the organic electroluminescent layer.

In one embodiment of the invention, a method of forming the transistor includes the following. A gate is formed on the substrate and a gate insulating layer is formed on the substrate to cover the gate. A channel layer is formed on the gate insulating layer, so that the channel layer is located above the gate. A source and a drain are formed on a portion of the channel layer, and the source is electrically insulated from the drain.

In one embodiment of the invention, the method of fabricating the organic electroluminescent display unit further includes the following. A passivation layer is formed to cover the transistor, the first photo-sensor, and the second photo-sensor.

In one embodiment of the invention, the method of fabricating the organic electroluminescent display unit further includes the following. A first contact window, a plurality of second contact windows, and a third contact window are formed in the passivation layer. The reflective pixel electrode is electrically connected to the transistor via the first contact window. The connection pattern is electrically connected to the first transparent top electrode, the first reflective bottom electrode, and the second reflective bottom electrode via the second contact windows, and the light-shielding pattern is electrically connected to the second transparent top electrode via the third contact window.

In one embodiment of the invention, the method of fabricating the organic electroluminescent display unit further includes the following. A pixel definition layer is formed to cover the conductive layer. The pixel definition layer has an opening and the reflective pixel electrode is exposed by the opening. The organic electroluminescent layer is disposed within the opening.

In one embodiment of the invention, the cathode layer covers the organic electroluminescent layer and the pixel definition layer.

In one embodiment of the invention, the cathode layer is a transparent cathode layer.

The invention is directed to an organic electroluminescent display unit and a method of fabricating the same so as to integrate a fabrication of photo-sensors into a fabrication of an organic electroluminescent display panel. Hence, the cost for fabricating the organic electroluminescent display unit of the invention can be further reduced.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 1A to 1E are schematic cross-sectional diagrams illustrating a flow chart of fabricating an organic electroluminescent display unit according to a first embodiment of the invention.

FIGS. 2A to 2E are schematic cross-sectional diagrams illustrating a flow chart of fabricating an organic electroluminescent display unit according to a second embodiment of the invention.

DESCRIPTION OF EMBODIMENTS

First Embodiment

Figure 1A:
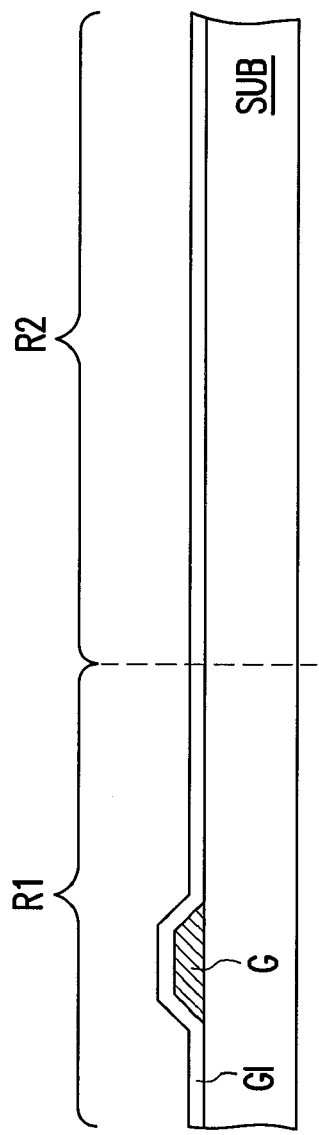

FIGS. 1A to 1E are schematic cross-sectional diagrams illustrating a flow chart of fabricating an organic electroluminescent display unit according to a first embodiment of the invention. Referring to FIG. 1A, a substrate SUB having a display region R1 and a peripheral region R2 is provided. At least one gate G is formed on the substrate SUB (only one gate is illustrated in FIG. 1A). A gate insulating layer GI is entirely formed on the substrate SUB to cover the gate G. In other words, the gate insulating layer GI covers the display region R1 and the peripheral region R2. In the present embodiment, the substrate SUB is fabricated using, for example, glass, quartz, organic polymer, opaque/reflective material (i.e. conductive material, wafer, ceramics, or other suitable material), or other suitable material. The display region R1 is a region configured to form an organic electroluminescent display unit. The peripheral region R2 is a region configured to form a peripheral circuit (i.e. a driving circuit, a fan-out circuit, and so on).

In the present embodiment, the gate G is fabricated with alloy, metal, or other suitable material, for instance. The gate insulating layer GI is entirely covered on the substrate SUB to cover the gate G. In the present embodiment, the gate insulating layer GI is fabricated using, for example, inorganic dielectric material (i.e. silicon oxide, silicon nitride, silicon oxynitride, or a stacked layer including at least two of the above material), organic dielectric material, or the combinations thereof.

Figure 1B:
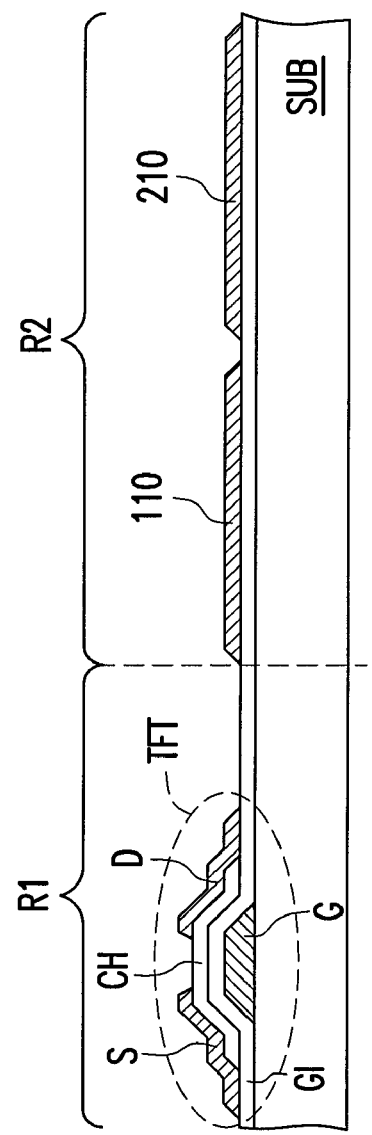

Referring to FIG. 1B, at least one channel layer CH is formed on the gate insulating layer GI. The channel layer CH is located above and partially overlapped with the gate G. In the present embodiment, the channel layer CH is fabricated using, for instance, amorphous silicon or other suitable semiconductor material. After the fabrication of the channel layer CH, a patterned conductive layer is formed. The patterned conductive layer is constituted by, for example, at least one source S, at least one drain D, at least one first reflective bottom electrode 110, and at least one second reflective bottom electrode 210. In the present embodiment, the patterned conductive layer is fabricated with alloy, metal, or other suitable materials, for instance.

As shown in FIG. 1B, the source S and the drain D located in the display region R1 are electrically insulated from each other and cover on a portion of the channel layer CH and a portion of the gate insulating layer GI. The first reflective bottom electrode 110 and the at least one second reflective bottom electrode 210 located in the peripheral region R2 are separated from each other. The first reflective bottom electrode 110 and the at least one second reflective bottom electrode 210 cover on a portion of the gate insulating layer GI. In the present embodiment, the first reflective bottom electrode 110 and the second reflective bottom electrode 210 are fabricated with aluminum, titanium, molybdenium, nickel, magnesium or other suitable metal or alloy, for instance.

After the fabrication of the source S and the drain D, the fabrication of at least one transistor TFT is completed. In the present embodiment, the transistor TFT is a bottom gate thin film transistor. However, in other embodiments of the invention, the transistor TFT can also be a top gate thin film transistor.

It should be noted that in the present embodiment, a scan line, a capacitive bottom electrode, or other conductive pattern can be fabricated simultaneously with the gate G (illustrated in FIG. 1A). Moreover, in the present embodiment, a data line, a capacitive top electrode, or other conductive pattern can be fabricated simultaneously with the source S, the drain D, the first reflective bottom electrode 110, and the second reflective bottom electrode 210. The capacitive bottom electrode and the capacitive top electrode constitute one or more capacitors. For example, a pixel structure of the organic electroluminescent display unit is constituted by two transistors and one capacitor, for example, and has the so-called 2T1C structure. Obviously, the pixel structure can also be constituted by three transistors and one capacitor (that is, the 3T1C structure), four transistors and two capacitors (that is, the 4T2C structure), or five transistors and one capacitor (that is, the 5T1C structure).

Referring to FIG. 1C, after the fabrication of the first reflective bottom electrode 110 and the second reflective bottom electrode 210, a first photo-sensitive layer 120, a second photo-sensitive layer 220, a first transparent top electrode 130, and a second transparent top electrode 230 are formed on the peripheral region R2. The first photo-sensitive layer 120 is located on a portion of the first reflective bottom electrode 110. The first transparent top electrode 130 is located on the first photo-sensitive layer 120. The second photo-sensitive layer 220 is located on a portion of the second reflective bottom electrode 210. The second transparent top electrode 230 is located on the second photo-sensitive layer 220. In other words, the first photo-sensitive layer 120 is sandwiched between the first reflective bottom electrode 110 and the first transparent top electrode 130, and the second photo-sensitive layer 220 is sandwiched between the second reflective bottom electrode 210 and the second transparent top electrode 230.

In the present embodiment, the first transparent top electrode 130 and the second transparent top electrode 230 are fabricated with metal oxide, for example. The first transparent top electrode 130 and the second transparent top electrode 230 are, for instance, fabricated with indium tin oxide (ITO), indium zinc oxide (IZO), aluminum tin oxide (ATO), aluminum zinc oxide (AZO), indium germanium zinc oxide (IGZO), or other suitable oxide, or a stacked layer including at least two of the above. Moreover, the first photo-sensitive layer 120 and the second photo-sensitive layer 220 are fabricated using, for instance, SiOx with Si nano-crystal or other suitable photo-sensing material.

As shown in FIG. 1C, after the fabrication of the first transparent top electrode 130 and the second transparent top electrode 230, a first photo-sensor 100 and a second photo-sensor 200 are fabricated. The first photo-sensor 100 includes the first reflective bottom electrode 110, the first photo-sensitive layer 120, and the first transparent top electrode 130. The second photo-sensor 200 includes the second reflective bottom electrode 210, the second photo-sensitive layer 220, and the second transparent top electrode 230. In the present embodiment, the first reflective bottom electrode 110 in the first photo-sensor 100 and the second reflective bottom electrode 210 in the second photo-sensor 200, the source S, and the drain D are fabricated with the same photolithography and etching process (PEP), for example. The first reflective bottom electrode 110, the second reflective bottom electrode 210, the source S, and the drain D are substantially fabricated with the same material.

Referring to FIG. 1D, after the fabrication of the first photo-sensor 100 and the second photo-sensor 200, a passivation layer PV covering the transistor TFT, the first photo-sensor 100, and the second photo-sensor 200 are formed on the substrate SUB. As shown in FIG. 1D, the passivation layer PV is entirely formed on the display region R1 and the peripheral region R2. The passivation layer PV has at least one first contact window W1, a plurality of second contact windows W2, and at least one third contact window W3. Here, the first contact window W1 exposes the drain D of the transistor TFT, the second contact windows W2 expose the first transparent top electrode 110, the first reflective bottom electrode 130, and the second reflective bottom electrode 210, and the third contact window W3 exposes the second transparent top electrode 230. In the present embodiment, the passivation layer PV is fabricated using silicon oxide, silicon nitride, silicon oxynitride, organic dielectric material, or other suitable dielectric material, for example.

Upon the fabrication of the passivation layer PV, a conductive layer 300 is formed on the passivation layer PV. The conductive layer 300 includes a reflective pixel electrode 310, a light-shielding pattern 320, and a connection pattern 330. The reflective pixel electrode 310 is electrically connected to the drain D of the transistor TFT via the first contact window W1. The connection pattern 330 is electrically connected to the first transparent top electrode 130, the first reflective bottom electrode 110, and the second reflective bottom electrode 210 via the second contact windows W2. The light-shielding pattern 320 is electrically connected to the second transparent top electrode 230 via the third contact window W3. Specifically, the first transparent top electrode 130 and the second reflective bottom electrode 210 are electrically connected to each other through the connection pattern 330 on the right-hand side. The first reflective bottom electrode 110 is only electrically connected to the connection pattern 330 on the left-hand side. In the present embodiment, the reflective pixel electrode 310, the light-shielding pattern 320, and the connection pattern 330 are fabricated with the same PEP, for example. In the present embodiment, the conductive layer 300 is fabricated using, for instance, silver, aluminum, titanium, molybdenum, nickel, magnesium, or other suitable metal or alloy.

As shown in FIG. 1D, the connection pattern 330 merely shields a portion of the first photo-sensitive layer 120, so that the first photo-sensitive layer 120 is capable of receiving external light. Furthermore, the light-shielding pattern 320 entirely shields the second photo-sensitive layer 220, such that the second photo-sensitive layer 220 does not receive external light easily.

Figure 1E:
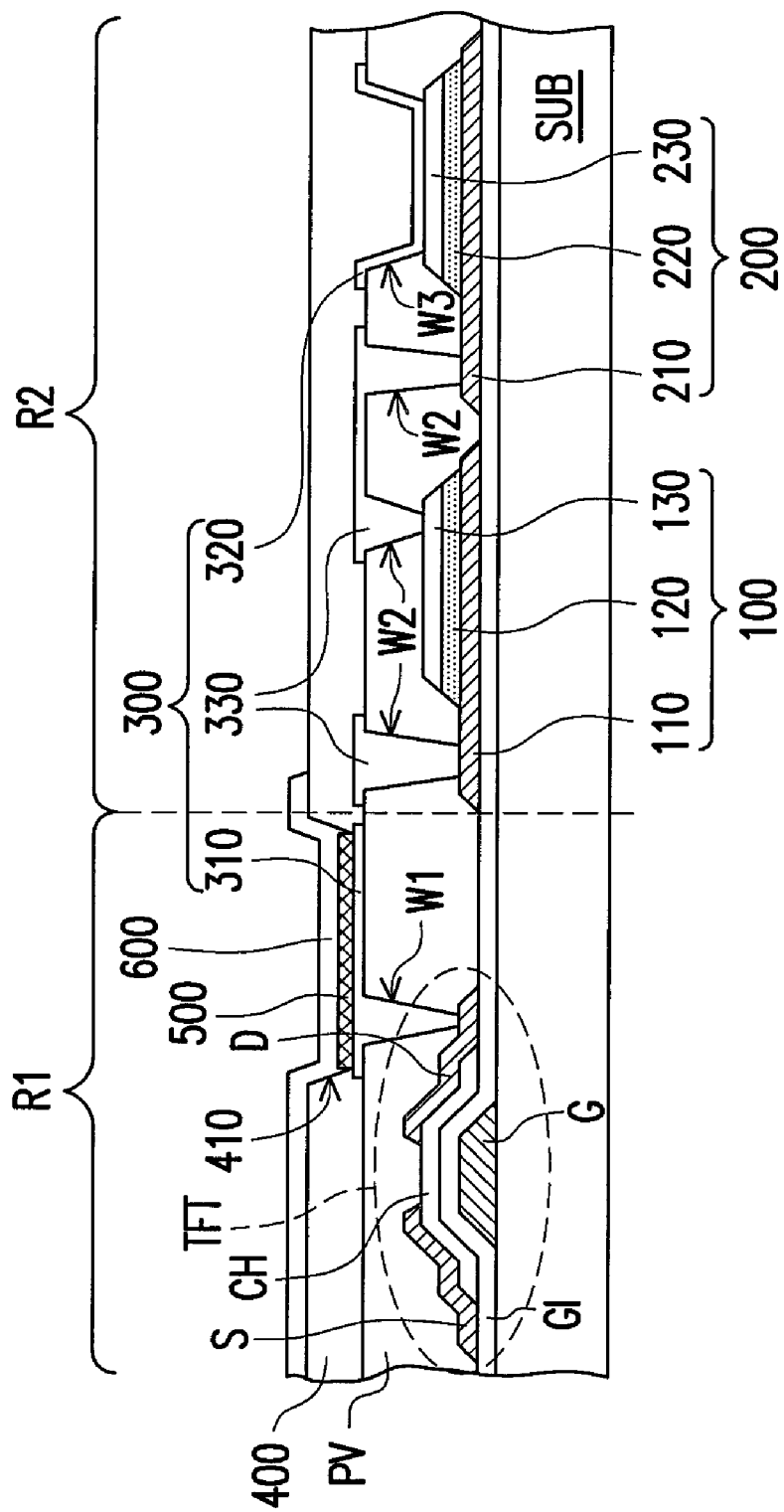

Referring to FIG. 1E, after the fabrication of the conductive layer 300, a pixel definition layer 400 is formed on the passivation layer PV to cover the conductive layer 300. The pixel definition layer 400 has an opening 410 to define a position of which an organic electroluminescent layer is to be subsequently formed (that is, a pixel region). Herein, the reflective pixel electrode 310 is exposed by the opening 410. An organic electroluminescent layer 500 is formed on the reflective pixel electrode 310 exposed by the opening 410. A cathode layer 600 is formed on the pixel definition layer 400 and the organic electroluminescent layer 500. In the present embodiment, the cathode layer 600 is a transparent cathode layer. After the fabrication of the cathode layer 600, the fabrication of a top emission OLED device is completed.

In the present embodiment, the organic electroluminescent layer 500 is stacked by multiple layers of organic thin films such as organic electroluminescent layers, hole injection layers, hole transport layers, electron injection layers, organic cladding layers, and the like. Moreover, the cathode layer 600 is fabricated with ITO, IZO, ATO, AZO, IGZO, or other suitable oxide, or a stacked layer including at least two of the above. In one embodiment of the invention, the cathode layer 600 does not entirely cover the first photo-sensor 100 and the second photo-sensor 200, such that electrical interference is prevented.

Figure 3:
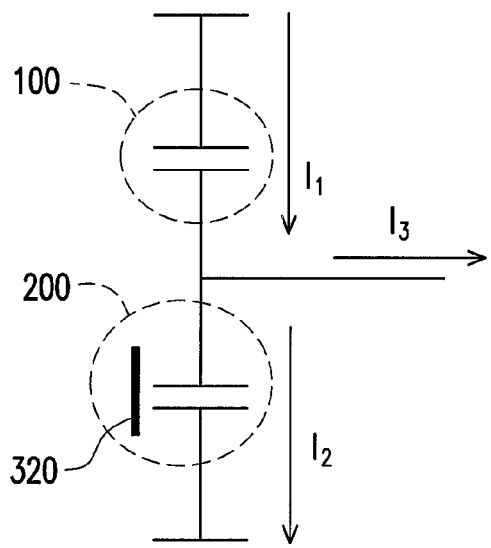
FIG. 3 is an equivalent circuit diagram of a first photo-sensor and a second photo-sensor.

FIG. 3 is an equivalent circuit diagram of a first photo-sensor and a second photo-sensor. Referring to FIG. 1D and FIG. 3, when irradiated by external light, the first photo-sensor 100 generates a photocurrent $I_1$, Shielded by the light-shielding pattern 320, the second photo-sensor 200 does not generate a photocurrent. However, the second photo-sensor 200 generates a dark current $I_2$. At this time, a photocurrent difference $I_3$ is generated between the first transparent top electrode 130 and the second reflective bottom electrode 210. Herein, the current difference $I_3 = I_1 - I_2$.

Figure 4:
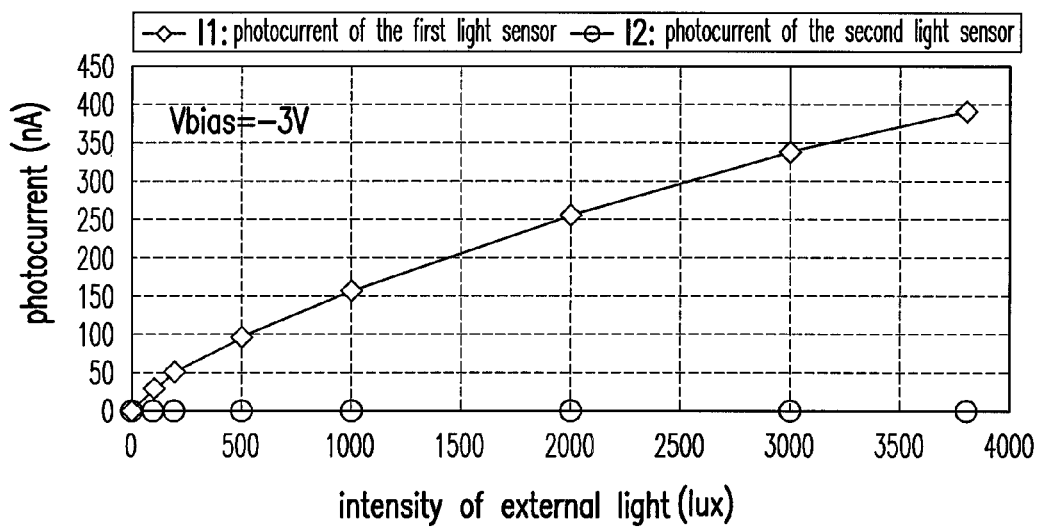
FIG. 4 is a diagram illustrating a relationship between photocurrents generated by the first photo-sensor and the second photo-sensor and an intensity of environmental light.

FIG. 4 is a diagram illustrating a relationship between photocurrents generated by the first photo-sensor and the second photo-sensor and an intensity of environmental light. Referring to FIG. 4, the photocurrent $I_3$ ($I_3 = I_1 - I_2$) increases as external light increases. Obviously, the photocurrent $I_3$ represents an intensity of external light. Thus, the environmental brightness of the location of the organic electroluminescent display unit can be calculated through the photocurrent $I_3$. Additionally, the dark current $I_2$ generated by the second photo-sensor 200 is adopted as a reference current. That is, the dark current $I_2$ represents a background current of the second photo-sensor when the second photo-sensor is not irradiated. Thus, photocurrent $I_3$ ($I_3 = I_1 - I_2$) can estimate the environmental brightness of the location of the organic electroluminescent display unit more accurately.

Second Embodiment

Figure 2A:
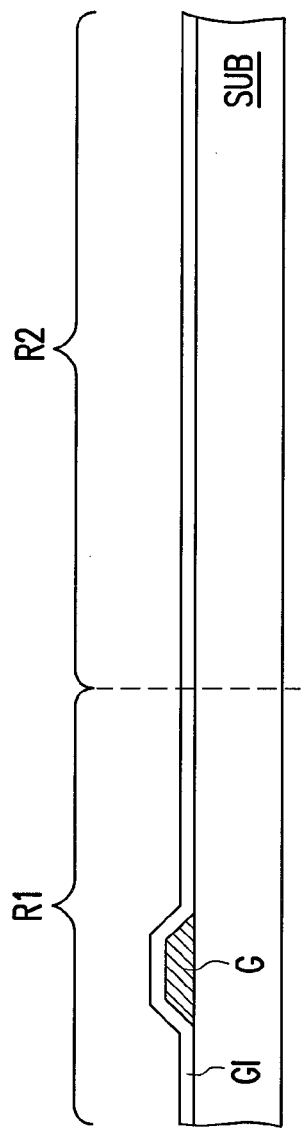
Figure 2B:
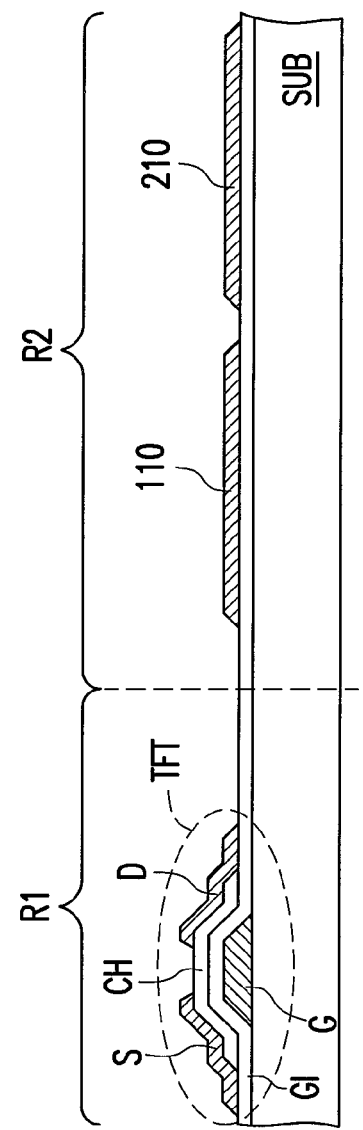
Figure 2E:
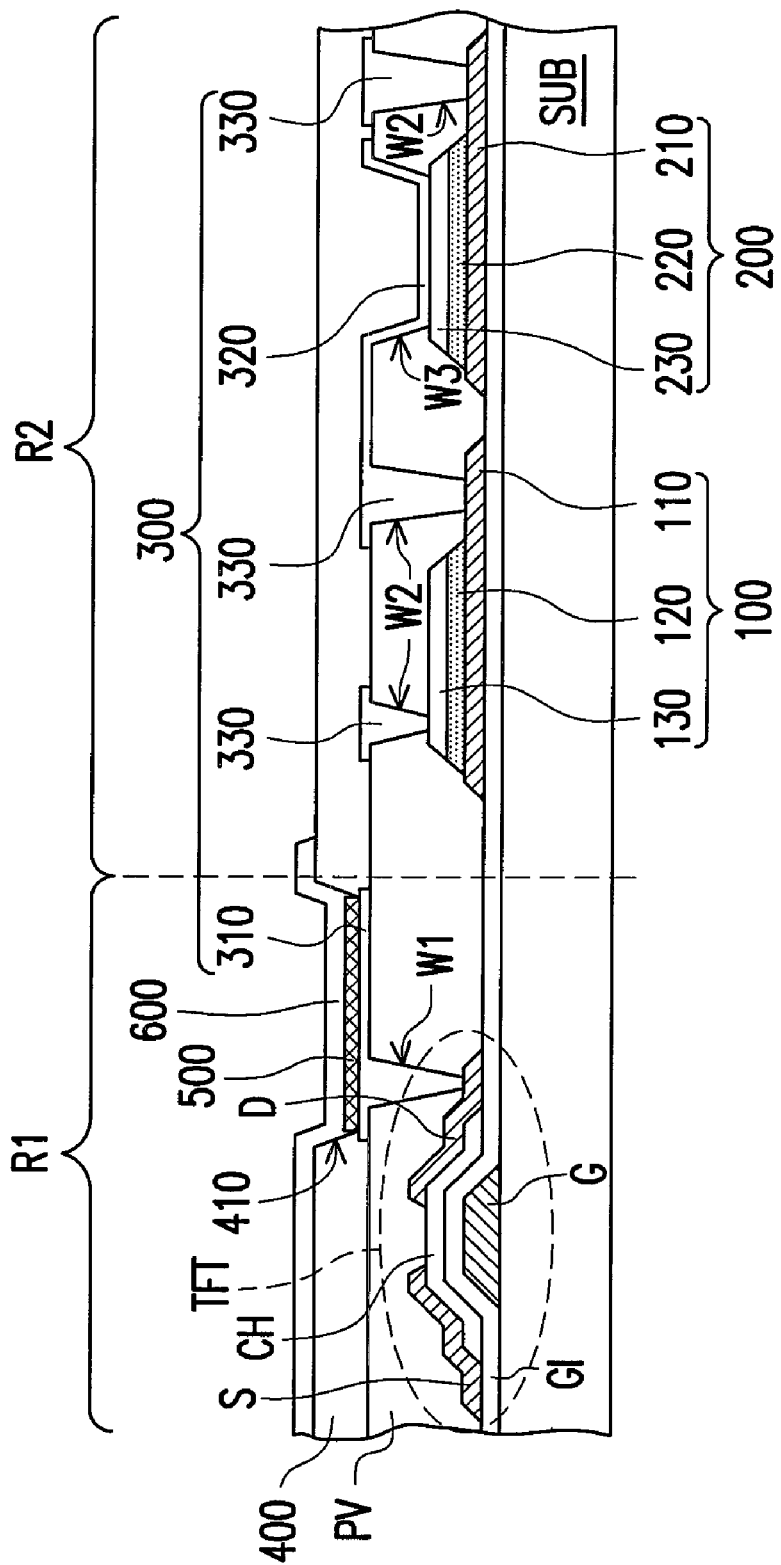

FIGS. 2A to 2E are schematic cross-sectional diagrams illustrating a flow chart of fabricating an organic electroluminescent display unit according to a second embodiment of the invention. A fabrication of the organic electroluminescent display unit of the present embodiment is similar to that of the first embodiment. However, the two embodiments are mainly different in that the connections between the first photo-sensor 100 and the second photo-sensor 200 are different. As shown in FIG. 2D, the first transparent top electrode 130 is merely electrically connected to the leftmost connection pattern 330. The second reflective bottom electrode 210 is merely electrically connected to the rightmost connection pattern 330. The first reflective bottom electrode 110 and the second transparent top electrode 230 are electrically connected to each other through the connection pattern 330 and the light-shielding pattern 320 there between.

In summary, the invention provides an organic electroluminescent display unit and a method of fabricating the same so as to integrate a fabrication of a photo-sensor into a fabrication of an organic electroluminescent display panel. Accordingly, the cost for fabricating the organic electroluminescent display unit of the invention can be further reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An organic electroluminescent display unit electrically connected to a scan line and a data line, comprising:
   at least one transistor electrically connected to the scan line and the data line;
   a first photo-sensor comprising a first reflective bottom electrode, a first photo-sensitive layer and a first transparent top electrode, wherein the first photo-sensitive layer is sandwiched between the first reflective bottom electrode and the first transparent top electrode;
   a second photo-sensor comprising a second reflective bottom electrode, a second photo-sensitive layer and a second transparent top electrode, wherein the second photo-sensitive layer is sandwiched between the second reflective bottom electrode and the second transparent top electrode, and the first photo-sensor is electrically connected to the second photo-sensor;
   a conductive layer comprising a reflective pixel electrode, a light-shielding pattern, and a connection pattern, wherein the reflective pixel electrode is electrically connected to the transistor, the light-shielding pattern is electrically connected to the second transparent top electrode and the light-shielding pattern entirely covers the second photo-sensitive layer, and the connection pattern is electrically connected to the first transparent top electrode, the first reflective bottom electrode, and the second reflective bottom electrode;
   an organic electroluminescent layer disposed on the reflective pixel electrode; and
   a cathode layer disposed on the organic electroluminescent layer.

2. The organic electroluminescent display unit as claimed in claim 1, wherein the transistor comprises a gate, a channel layer, a source, and a drain, the source and the drain are located on a portion of the channel layer, and the source and the drain are electrically insulated from each other.

3. The organic electroluminescent display unit as claimed in claim 2, wherein the channel layer is located above the gate.

4. The organic electroluminescent display unit as claimed in claim 2, wherein the first reflective bottom electrode. the second reflective bottom electrode, the source, and the drain are substantially fabricated with a same material.

5. The organic electroluminescent display unit as claimed in claim 1, wherein the connection pattern merely shields a portion of the first photo-sensitive layer such that the first photo-sensitive layer is capable of receiving an external light.

6. The organic electroluminescent display unit as claimed in claim 1 further comprising a passivation layer covering the transistor, the first photo-sensor, and the second photo-sensor.

7. The organic electroluminescent display unit as claimed in claim 6, wherein the passivation layer has a first contact window, a plurality of second contact windows, and a third contact window, the reflective pixel electrode is electrically connected to the transistor via the first contact window, the connection pattern is electrically connected to the first transparent top electrode, the first reflective bottom electrode, and the second reflective bottom electrode via the second contact windows, and the light-shielding pattern is electrically connected to the second transparent top electrode via the third contact window.

8. The organic electroluminescent display unit as claimed in claim 1, further comprising a pixel definition layer covering the conductive layer, wherein the pixel definition layer has an opening, the reflective pixel electrode is exposed by the opening, and the organic electroluminescent layer is disposed within the opening.

9. The organic electroluminescent display unit as claimed in claim 8, wherein the cathode layer covers the organic electroluminescent layer and the pixel definition layer.

10. The organic electroluminescent display unit as claimed in claim 9, wherein the cathode layer is a transparent cathode layer.

11. A method of fabricating an organic electroluminescent display unit, comprising:
  forming at least one transistor on a substrate;
  forming a first photo-sensor and a second photo-sensor electrically connected to the first photo-sensor on the substrate, the first photo-sensor comprising a first reflective bottom electrode, a first photo-sensitive layer, and a first transparent top electrode, the first photo-sensitive layer being sandwiched between the first reflective bottom electrode and the first transparent top electrode, and the second photo-sensor comprising a second reflective bottom electrode, a second photo-sensitive layer, and a second transparent top electrode, the second photo-sensitive layer being sandwiched between the second reflective bottom electrode and the second transparent top electrode;
  forming a conductive layer comprising a reflective pixel electrode, a light-shielding pattern, and a connection pattern, wherein the reflective pixel electrode is electrically connected to the transistor, the light-shielding pattern is electrically connected to the second transparent top electrode and the light-shielding pattern entirely covers the second photo-sensitive layer, and the connection pattern is electrically connected to the first transparent top electrode, the first reflective bottom electrode, and the second reflective bottom electrode;
  forming an organic electroluminescent layer on the reflective pixel electrode; and
  forming a cathode layer on the organic electroluminescent layer.

12. The method of fabricating the organic electroluminescent display unit as claimed in claim 11, wherein a method of forming the transistor comprises:
  forming a gate on the substrate;
  forming a gate insulating layer on the substrate to cover the gate;
  forming a channel layer on the gate insulating layer, and the channel layer being located above the gate; and
  forming a source and a drain on a portion of the channel layer, the source being electrically insulated from the drain.

13. The method of fabricating the organic electroluminescent display unit as claimed in claim 11, further comprising forming a passivation layer to cover the transistor, the first photo-sensor, and the second photo-sensor.

14. The method of fabricating the organic electroluminescent display unit as claimed in claim 13, further comprising forming a first contact window, a plurality of second contact windows, and a third contact window in the passivation, wherein the reflective pixel electrode is electrically connected to the transistor via the first contact window, the connection pattern is electrically connected to the first transparent top electrode, the first reflective bottom electrode, and the second reflective bottom electrode via the second contact windows, and the light-shielding pattern is electrically connected to the second transparent top electrode via the third contact window.

15. The method of fabricating the organic electroluminescent display unit as claimed in claim 11, further comprising forming a pixel definition layer to cover the conductive layer, wherein the pixel definition layer has an opening, the reflective pixel electrode is exposed by the opening, and the organic electroluminescent layer is disposed within the opening.

16. The method of fabricating the organic electroluminescent display unit as claimed in claim 15, wherein the cathode layer covers the organic electroluminescent layer and the pixel definition layer.

17. The method of fabricating the organic electroluminescent display unit as claimed in claim 16, wherein the cathode layer is a transparent cathode layer.

* * * * *